(12) United States Patent
Ota et al.

(10) Patent No.: US 10,312,289 B1
(45) Date of Patent: Jun. 4, 2019

(54) SEMICONDUCTOR MEMORY DEVICE (71) Applicant: TOSHIBA MEMORY CORPORATION, Minato-ku (JP)

(72) Inventors: Kensuke Ota, Yokkaichi (JP); Masumi Saitoh, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/040,671

(22) Filed: Jul. 20, 2018

(30) Foreign Application Priority Data

Mar. 19, 2018 (JP) ................................. 2018-050592

(51) Int. Cl.
*H01L 27/24* (2006.01)
*H01L 45/00* (2006.01)
*G11C 13/00* (2006.01)
*H01L 23/528* (2006.01)

(52) U.S. Cl.
CPC ........ *H01L 27/2454* (2013.01); *G11C 13/004* (2013.01); *G11C 13/0007* (2013.01); *G11C 13/0069* (2013.01); *G11C 13/0097* (2013.01); *H01L 23/528* (2013.01); *H01L 27/249* (2013.01); *H01L 45/1233* (2013.01); *H01L 45/146* (2013.01); *G11C 2013/005* (2013.01); *G11C 2013/009* (2013.01); *G11C 2213/15* (2013.01); *G11C 2213/32* (2013.01); *G11C 2213/52* (2013.01); *G11C 2213/71* (2013.01);
(Continued)

(58) Field of Classification Search
CPC .............. H01L 27/2454; H01L 27/249; H01L 45/1233; G11C 2213/71; G11C 2213/75; G11C 2213/79
See application file for complete search history.

(56) References Cited

U.S. PATENT DOCUMENTS 8,563,961 B2 * 10/2013 Sasago ................ H01L 27/2409
257/4
8,829,590 B2  9/2014 Park
9,076,523 B2  7/2015 Lee et al.
(Continued)

FOREIGN PATENT DOCUMENTS

JP  2015-141726  8/2015
JP  2016-527710  9/2016

OTHER PUBLICATIONS

N. Shukla, et al., Ag/HfO$_2$ based Threshold Switch with Extreme Non-Linearity for Unipolar Cross-Point Memory and Steep-slope Phase FETs, IEEE, 2016, pp. 34.6.1-34.6.4.

*Primary Examiner* — Allison Bernstein
(74) *Attorney, Agent, or Firm* — Oblon, McClelland, Maier & Neustadt, L.L.P.

(57) ABSTRACT

A semiconductor memory device comprises a substrate, a plurality of first wirings arranged in a first direction crossing a surface of the substrate, a second wiring extending in the first direction, a variable resistance film provided between the first wiring and the second wiring, a third wiring extending in a second direction crossing the first direction, a select transistor provided between an end of the second wiring and the third wiring. In addition, the semiconductor memory device comprises a chalcogen layer provided at at least a position between the end of the second wiring and the select transistor, and, a position between the third wiring and the select transistor.

9 Claims, 10 Drawing Sheets

(52) U.S. Cl.
CPC ...... *G11C 2213/75* (2013.01); *G11C 2213/79* (2013.01)

(56) References Cited

U.S. PATENT DOCUMENTS

| | | |
|---|---|---|
| 9,275,729 B2 | 3/2016 | Ota et al. |
| 9,613,689 B1 * | 4/2017 | Takaki ............... G11C 13/0026 |
| 9,728,584 B2 | 8/2017 | Ramaswamy et al. |
| 2016/0268304 A1 | 9/2016 | Ikeda et al. |

* cited by examiner

SEMICONDUCTOR MEMORY DEVICE

CROSS-REFERENCE TO RELATED APPLICATIONS

This application is based upon and claims the benefit of Japanese Patent Application No. 2018-050592, filed on Mar. 19, 2018, the entire contents of which are incorporated herein by reference.

BACKGROUND

Field

Embodiments described herein relates to a semiconductor memory device.

Description of the Related Art

Along with high integration of a semiconductor memory device, development of a semiconductor memory device in which memory cells are disposed three-dimensionally proceeds. As such a semiconductor memory device, a so-called ReRAM including a resistance change element which reversibly changes its resistance value as a memory cell, a so-called flash memory including a field effect transistor including a gate insulating layer capable of accumulating charge as a memory cell, or the like are known.

In such semiconductor memory devices, select elements such as a select transistor and the like are used in order to apply a voltage selectively to a target memory cell for a reading operation, a writing operation, an erasing operation, and the like.

The invention according to the embodiments described later provides a semiconductor memory device including the select element of preferred characteristics.

DETAILED DESCRIPTION

A semiconductor memory device according to one embodiment of the present invention includes a substrate, a plurality of first wirings arranged in a first direction crossing a surface of the substrate, a second wiring extending in the first direction, a variable resistance film provided between the first wiring and the second wiring, a third wiring extending in a second direction crossing the first direction, and a select transistor provided between an end of the second wiring and the third wiring. In addition, the semiconductor memory device includes a chalcogen layer provided at at least one of a position between the end of the second wiring and the select transistor, and, a position between the third wiring and the select transistor.

Next, the semiconductor memory device according to the embodiment is described in detail with reference to drawings. Note that embodiments described later are merely examples, and are not shown with the intention of limiting the present invention.

Moreover, in this specification, a direction crossing a surface of a substrate will be called a first direction, a direction crossing the first direction will be called a second direction, and a direction crossing the first direction and the second direction will be called a third direction. Moreover, a direction moving away from the substrate along the first direction will be called an upper direction, and a direction moving towards the substrate along the first direction will be called a downward direction. Moreover, when a lower surface or a lower end is referred to for a configuration, this is assumed to mean a surface or an end nearer to the substrate of this configuration, and when an upper surface or an upper end is referred to for a configuration, this is assumed to mean a surface or an end farther from the substrate of this configure. Moreover, a surface crossing the second direction or the third direction will be called a side surface. In addition, a direction parallel to the surface of the substrate will be called an X direction, a direction parallel to the surface of the substrate and perpendicular to the X direction will be called a Y direction, and a direction perpendicular to the surface of the substrate will be called a Z direction. Note that the description below exemplifies a case where the Y direction corresponds with the second direction, and the Z direction corresponds with the first direction. However, the first direction and the second direction are not limited to the Z direction and the Y direction.

First Embodiment

[Configuration]

Next, with reference to FIG. 1-FIG. 4, a configuration of a semiconductor memory device according to a first embodiment will be described.

Figure 1:
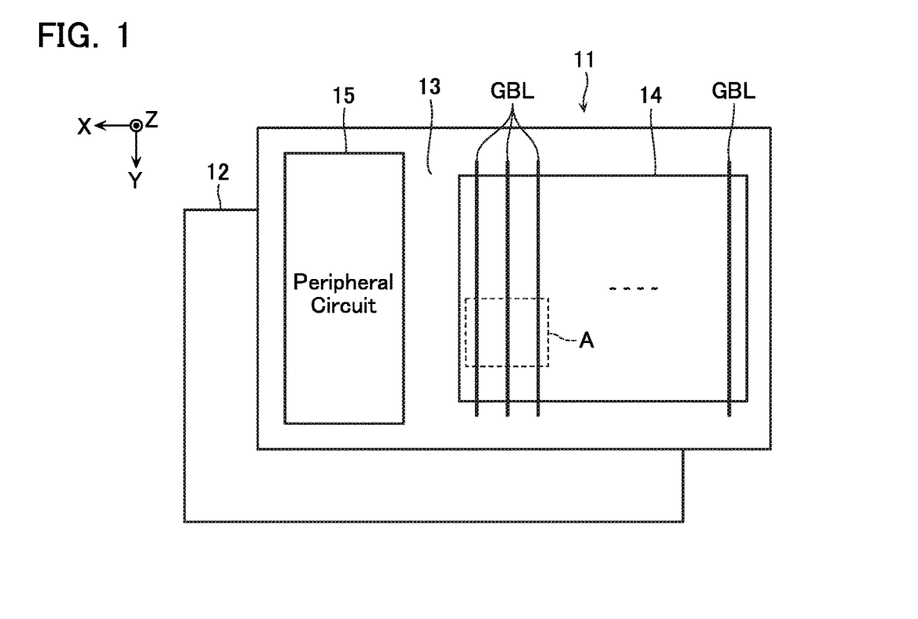
FIG. 1 is a schematic plan view of the semiconductor memory device according to a first embodiment.

FIG. 1 is a schematic plan view of the semiconductor memory device according to the first embodiment.

The semiconductor memory device according to this embodiment includes a memory die 11 and a control die 12. The memory die 11 includes a substrate 13, and, includes a memory cell array 14 and a peripheral circuit 15 provided above the substrate 13. The substrate 13 is a semiconductor substrate including monocrystalline silicon (Si) or the like, for example. The memory cell array 14 stores data. The control die 12 controls the memory cell array 14 via the peripheral circuit 15.

Figure 2:
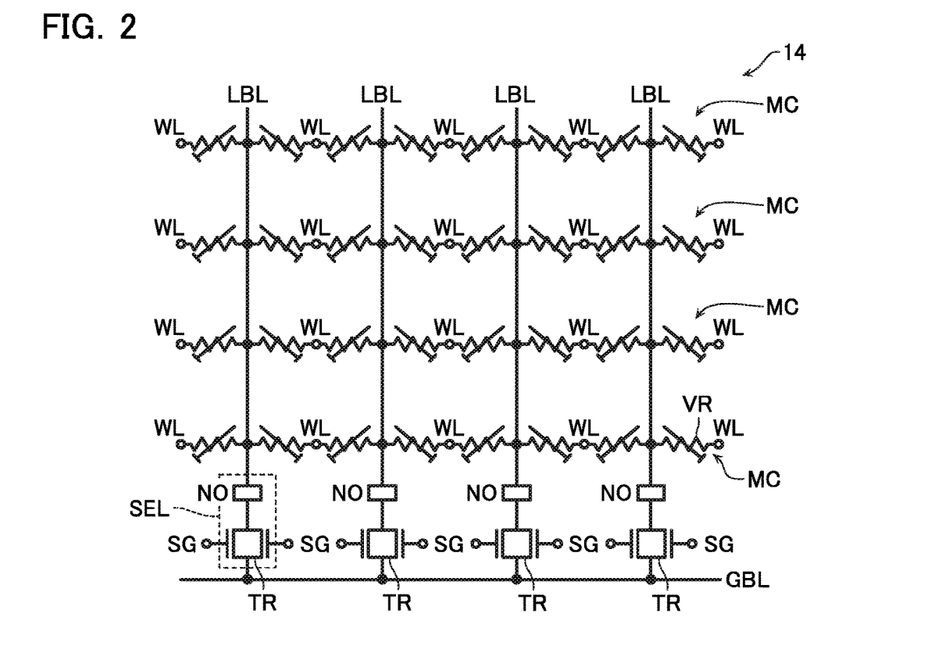
FIG. 2 is a schematic circuit diagram showing a configuration of a part of the semiconductor memory device.

FIG. 2 is a schematic circuit diagram showing a configuration of a part of the memory cell array 14.

The memory cell array 14 includes a global bit line GBL connected to the peripheral circuit 15 (shown in FIG. 1), a plurality of local bit lines LBL connected to the global bit line GBL via a plurality of select elements SEL, a plurality of memory cells MC connected to the local bit line LBL, and a plurality of word lines WL connected to the plurality of the memory cells MC respectively and connected to the peripheral circuit 15 (shown in FIG. 1). The select element SEL includes a select transistor TR and a nonlinear element NO connected in series between the global bit line GBL and the local bit line LBL.

The memory cell MC is a storage element which stores data of 1 bit or more. The memory cell MC according to this embodiment includes a pair of electrodes and a variable resistance element VR provided between these electrodes. The variable resistance element VR is set to a low resistance state by applying a predetermined set voltage, and is reset to a high resistance state by applying a predetermined reset voltage, for example. It is noted that the memory cell MC may include a rectifier element connected to the variable resistance element VR in series.

The select transistor TR is a field-effect transistor. The select transistor TR includes a source electrode connected to the global bit line GBL, a drain electrode connected to the nonlinear element NO, and a gate electrode connected to the peripheral circuit 15 (shown in FIG. 1) via a select gate line SG.

The nonlinear element NO includes, for example, a pair of electrodes and a switch element provided between these electrodes. When a voltage applied between these electrodes is less than a threshold voltage, the switch element is in a high resistance state such as electrically non-conductive state. When a voltage applied between these electrodes is more than the threshold voltage, the switch element is in a low resistance state such as electrically conductive state. The switch element has this function to bipolar voltages, for example.

In a reading operation or a writing operation, a voltage is selectively applied to a memory cell MC (it is hereafter called "selected memory cell MC".) which is a target of the reading operation or the writing operation using the select element SEL. That is, the select transistor TR connected to the selected memory cell MC is controlled in an ON state, and the other select transistors TR are controlled in an OFF state. Further, a predetermined reading voltage or the set voltage is applied between a word line WL connected to the select memory cell MC and the global bit line GBL.

In an erasing operation, the reset voltage may be selectively applied to the selected memory cell MC like in the reading operation or the writing operation by using the select element SEL. On the other hand, a plurality of local bit lines LBL may be connected to one global bit line GBL via the select element SEL, and, the reset voltage may be applied to a plurality of memory cells MC simultaneously.

Figure 3:
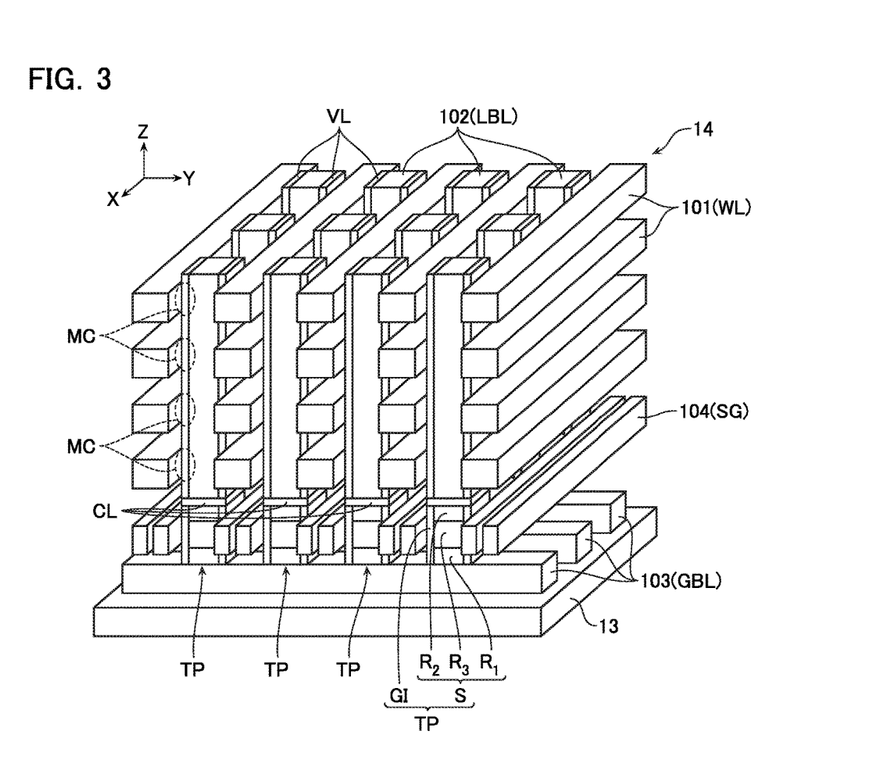
FIG. 3 is a schematic perspective view of the portion shown by "A" in FIG. 1.
Figure 4:
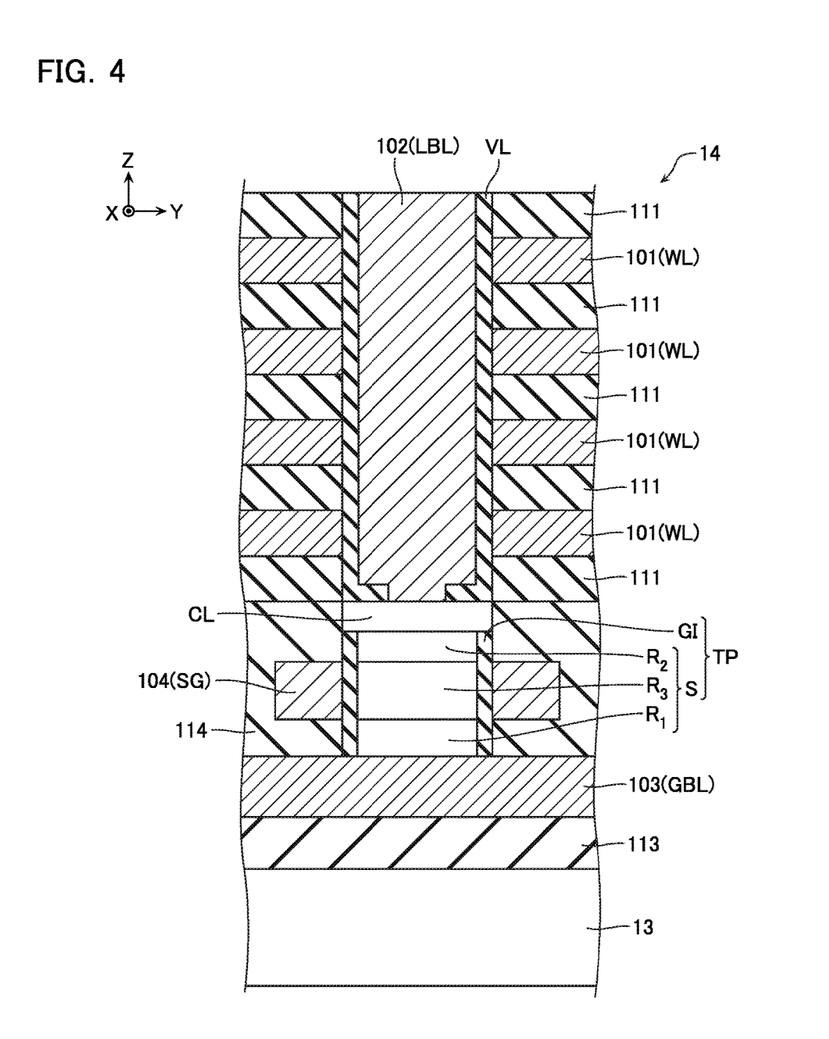
FIG. 4 is a schematic sectional view of the configuration shown in FIG. 3 seen from an X direction.

FIG. 3 is a schematic perspective view showing a configuration of a part of the memory cell array 14. FIG. 3 corresponds to a portion shown by "A" in FIG. 1. FIG. 4 is a schematic sectional view of the configuration shown in FIG. 3 seen from an X direction.

As shown in FIG. 3, above the substrate 13, a plurality of first wirings 101, a plurality of second wirings 102 crossing these plurality of first wirings 101 and a plurality of variable resistance films VL provided between these plurality of first wirings 101 and second wirings 102 are provided. Further, between these configurations and the substrates 13, a plurality of third wirings 103, a plurality of transistor portions TP provided on upper surfaces of these third wirings 103, a plurality of chalcogen layers CL provided on upper surfaces of these transistor portions TP, and a plurality of fourth wirings 104 provided on side surfaces of the transistor portions TP in a Y direction are provided.

The first wirings 101 are arranged in the Y direction and a Z direction, and, are extending in the X direction. Each of the first wirings 101 functions as the word line WL and the electrodes of one side of a plurality of memory cells MC arranged in the X direction. The first wirings 101 include conductive materials such as polycrystalline silicon (p-Si), tungsten (W) and titanium nitride (TiN), for example. Between the first wirings 101 adjacent to each other in the Z direction, insulating layers 111 (shown in FIG. 4) including $SiO_2$ or the like are provided.

The second wirings 102 are arranged in the X direction and the Y direction, and, are extending in the Z direction. Each of the second wirings 102 functions as the local bit line LBL, electrodes of the other side of the plurality of memory cells MC arranged in the Z direction, and, the electrode of one side of the nonlinear element NO. The second wirings 102 include conductive materials such as polycrystalline silicon (p-Si), tungsten (W) and titanium nitride (TiN), for example. Between the second wirings 102 adjacent to each other in the X direction, an insulating layer including $SiO_2$ or the like (not shown) is provided.

The variable resistance films VL are provided in both sides of the second wirings 102 in the Y direction, and are arranged in the X direction and the Y direction so as to correspond to the second wirings 102. Further, each of the variable resistance films VL is extending in the Z direction along the side surface of the second wiring 102 in the Y direction, and functions as a plurality of variable resistance elements VR arranged in the Z direction. The variable resistance film VL may be a laminated film including a metal layer such as copper (Cu) or silver (Ag), and, an insulating layer such as silicon oxide ($SiO_2$), for example. Further, the variable resistance film VL may be a transition metal oxide such as hafnium oxide (HfOx), for example. Further, the variable resistance film VL may change its resistance value reversibly by changing its crystal structure. It is noted that the variable resistance films VL may be provided on both side surfaces of the first wirings 101 in the Y direction, and may be arranged in the Y direction and the Z direction so as to correspond to the first wirings 101, for example. In this case, each of the variable resistance films VL may be extending in the X direction along the side surface of the first wiring 101 in the Y direction, and may function as a plurality of variable resistance elements VR arranged in the X direction. Further, each of the variable resistance films VL may be extending, for example, in the X direction and the Z direction, and may function as a plurality of variable resistance elements VR arranged in the Z direction and the X direction.

The third wirings 103 are arranged in the X direction so as to correspond to the second wirings 102, and are extending in the Y direction. Each of the third wirings 103 functions as the global bit line GBL and source electrodes of a plurality of select transistors TR arranged in the Y direction. The third wirings 103 include conductive materials such as polycrystalline silicon (p-Si), tungsten (W) and titanium nitride (TiN), for example. Between the substrate 13 and the third wirings 103, an insulating layer 113 (shown in FIG. 4) including $SiO_2$ or the like is provided. Further, between the third wirings 103 adjacent to each other in the X direction, an insulating layer including $SiO_2$ or the like (not shown) is provided.

The transistor portions TP are arranged in the X direction and the Y direction so as to correspond to the second wirings 102. Each of the transistor portions TP functions as a select transistor TR together with the fourth wirings 104. Each of the transistor portions TP includes a semiconductor layer S connected to the third wiring 103 and an insulating film GI provided on both side surfaces of the semiconductor layer S in the Y direction. The semiconductor layer S includes polycrystalline silicon (p-Si) or the like, for example. Further, the semiconductor layer S includes a first semiconductor region $R_1$, a second semiconductor region $R_2$, and a third semiconductor region $R_3$. The first semiconductor region $R_1$ is located in a lower position than the second semiconductor region $R_2$ and the third semiconductor region $R_3$. Further, the first semiconductor region $R_1$ includes n type impurities such as phosphorus (P), for example, and functions as a source region of the select transistor TR. The second semiconductor region $R_2$ is located in an upper position than the first semiconductor region $R_1$ and the third semiconductor region $R_3$, and is away from the first semiconductor region $R_1$ in the Z direction. Further, the second semiconductor region $R_2$ includes n type impurities such as phosphorus (P), for example, and functions as a drain region and a drain electrode of the select transistor TR, and, as the electrode of the other side of the nonlinear element NO. The third semiconductor region $R_3$ is located between the first semiconductor region $R_1$ and the second semiconductor region $R_2$. Further, the third semiconductor region $R_3$ includes p type impurities such as boron (B), for example, and functions as a channel region of the select transistor TR. The insulating film GI includes $SiO_2$ or the like, for example, and functions as a gate insulating film of the select transistor TR.

The chalcogen layer CL is connected to the semiconductor layer S of the transistor portion TP in this embodiment. The chalcogen layer CL functions as the switch element of the nonlinear element NO. The chalcogen layer CL includes at least one or more types of chalcogen elements selected from a group consisting of tellurium (Te), selenium (Se), and sulfur (S), or chalcogenide which is a compound including, such a chalcogen element. Further, the chalcogen layer CL may include at least one or more types of elements selected from a group consisting of boron (B), aluminum (Al), gallium (Ga), indium (In), carbon (C), silicon (Si), germanium (Ge), tin (Sn), arsenic (As), phosphorus (P) and antimony (Sb) in addition to these chalcogen elements and chalcogenide.

The fourth wirings 104 are provided on both side surfaces of the transistor portions TP in the Y direction, and are arranged in the Y direction so as to correspond to the transistor portions TP. Each of the fourth wirings 104 is extending in the X direction, and faces the side surfaces in the Y direction of the third semiconductor regions $R_3$ of a plurality of semiconductor layers S arranged in the X direction. Each of the fourth wirings 104 functions as the select gate line SG and gate electrodes of a plurality of select transistors TR arranged in the X direction. The fourth wirings 104 include conductive materials such as polycrystalline silicon (p-Si), tungsten (W) and titanium nitride (TiN), for example. Between the fourth wirings 104 adjacent to each other in the Y direction, insulating layers 114 (shown in FIG. 4) including $SiO_2$ or the like is provided. It is noted that, in the example shown in FIG. 3, two of the fourth wirings 104 are provided between the transistor portions TP adjacent to each other in the Y direction. However, one fourth wiring 104 may be provided between the transistor portions TP adjacent to each other in the Y direction. Further, the fourth wirings 104 may have a so-called surround gate type structure. In this case, each of the fourth wirings 104 faces the side surfaces in the X direction and the Y direction of the third semiconductor regions $R_3$ of the semiconductor layers S arranged in the X direction.

[Characteristics of Select Element SEL]

Improvements of characteristics of select elements are desired. For example, it is preferable that a current which flows through the select element SEL when the select transistor TR is the ON state (it is hereafter called "ON current".) is larger. It is because the reading operation, the writing operation, the erasing operation and the like can be performed at higher speed as the ON current is larger. On the other hand, it is preferable that a current which flows through the select element SEL when the select transistor TR is in the OFF state (it is hereafter called "leakage current".) is smaller. It is because generation of malfunction can be more preferably suppressed as the leakage current is smaller. Here, the ON current can be increased by shortening a length of the channel region (channel length) of the select transistor TR, for example. However, in such a case, the leakage current also increases.

Accordingly, in the present embodiment, the select element SEL including the select transistor TR and the nonlinear element NO provided with the chalcogen layer CL is used. That makes it possible to increase the ON current and to decrease the leakage current simultaneously. This point will be described below.

Figure 5:
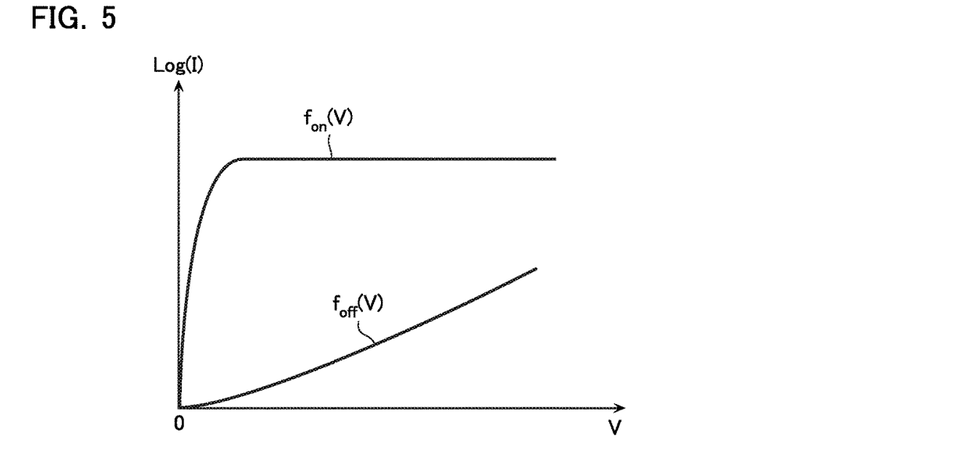
FIG. 5 is a schematic graph showing current-voltage characteristics of a select transistor TR.

FIG. 5 is a schematic graph showing current-voltage characteristics of the select transistor TR. The axis of abscissa shows a voltage V between the source electrode and the drain electrode, and the axis of ordinate is a logarithmic axis which shows a current I which flows through the select element SEL.

A function $f_{on}(V)$ shown in FIG. 5 is a function which shows a relationship between the voltage V between the source electrode and the drain electrode and the current I in a case where the select transistor TR is in the ON state. When the voltage V is small, the current I increases approximately in proportion to an increase of the voltage V. When the voltage V is more than a certain voltage, the current I reaches a saturation current.

A function $f_{off}(V)$ shown in FIG. 5 is a function which shows a relationship between the voltage V between the source electrode and the drain electrode and the current I in a case where the select transistor TR is in the OFF state. Although the current I is small compared with the ON current, the current I increases exponentially with the increase of the voltage V.

Figure 6:
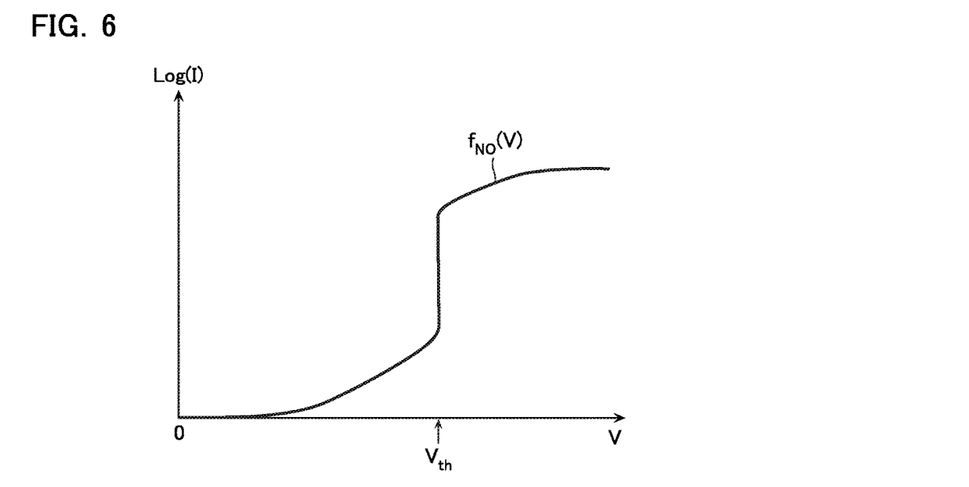
FIG. 6 is a schematic graph showing a current-voltage characteristic of a nonlinear element NO.

FIG. 6 is a schematic graph showing a current-voltage characteristic of the nonlinear element NO. The axis of abscissa shows a voltage V applied to the nonlinear element NO and the axis of ordinate is a logarithmic axis which shows a current I which flows through the nonlinear element NO.

A function $f_{NO}(V)$ in FIG. 6 is a function which shows a relationship between the voltage V and the current I of the nonlinear element NO. As described above, the nonlinear element NO is in a high resistance state when the voltage V is less than a threshold voltage $V_{th}$, and is in a low resistance state when the voltage V is more than the threshold voltage $V_{th}$. That is, if the voltage V is increased gradually, the current I increases by two or more digits at a timing when the voltage V reaches the threshold voltage $V_{th}$.

The reason why such a current-voltage characteristic is obtained by the nonlinear element NO including the chalcogen layer CL is considered as follows.

Figure 7:
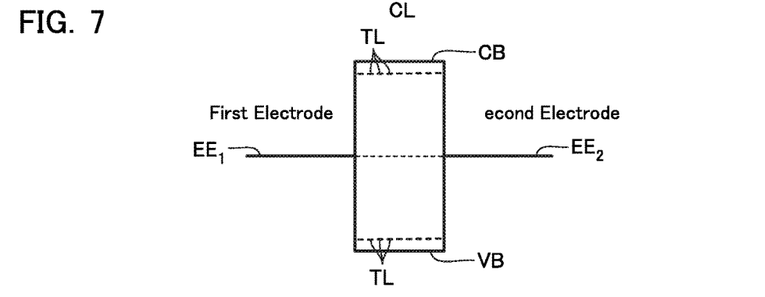
FIG. 7 is a schematic energy band diagram of the nonlinear element NO.

That is, as shown in FIG. 7, the nonlinear element NO includes a first electrode, a second electrode, and the chalcogen layer CL connected to the first electrode and the second electrode. Energy differences exist between a conduction band CB of the chalcogen layer CL and an energy level $EE_1$ of the first electrode, and between the conduction band CB of the chalcogen layer CL and an energy level $EE_2$ of the second electrode. A plurality of trap levels TL exist in the vicinity of the conduction band CB and the valence band VB of the chalcogen layer CL.

Figure 8:
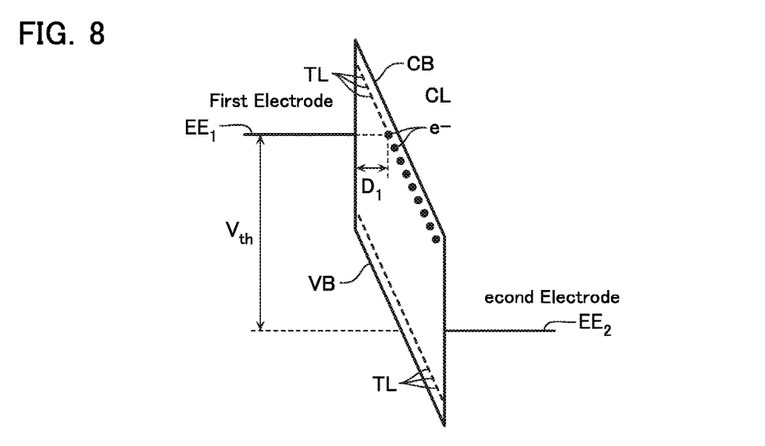
FIG. 8 is a schematic energy band diagram of the nonlinear element NO.

As shown in FIG. 8, when a voltage is applied to the nonlinear element NO, for example, if the energy level $EE_1$ of the first electrode is larger than the energy level $EE_2$ of the second electrode, a potential gradient arises in the chalcogen layer CL according to this energy difference. When this energy difference is increased gradually and the potential difference between electrodes reaches the threshold voltage $V_{th}$, the energy of the trap level TL which exists in the position apart by a distance $D_1$ from the first electrode becomes substantially the same as the energy of the energy level $EE_1$ of the first electrode. Here, the distance $D_1$ is a distance at which electrons $e^-$ can tunnel. Therefore, when the potential difference between electrodes reaches the threshold voltage $V_{th}$, the electrons e in the first electrode tunnel at the trap level TL in the vicinity of the conduction band CB. The electrons $e^-$ in the trap level TL tunnel at other trap levels TL with lower energy. Thereby, the trap levels TL which are apart by more the distance $D_1$ from the first electrode are filled with the electrons $e^-$.

Figure 9:
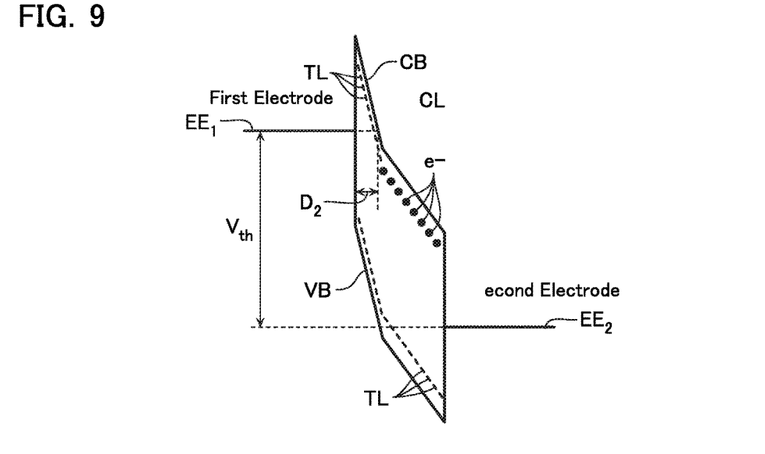
FIG. 9 is a schematic energy band diagram of the nonlinear element NO.

As shown in FIG. 9, when the electrons $e^-$ are accumulated into the chalcogen layer CL, energy of a part of the chalcogen layer CL decreases. According to this, a potential gradient in the vicinity of the second electrode becomes gentle, and a potential gradient in the vicinity of the first electrode becomes steep. Thereby, a width $D_2$ of the energy barrier between the first electrode and the conduction band CB becomes small, and the tunnel of the electrons $e^-$ in the first electrode into the conduction band CB is enabled. That is, the chalcogen layer CL becomes in a low resistance state, and a current begins to flow.

Figure 10:
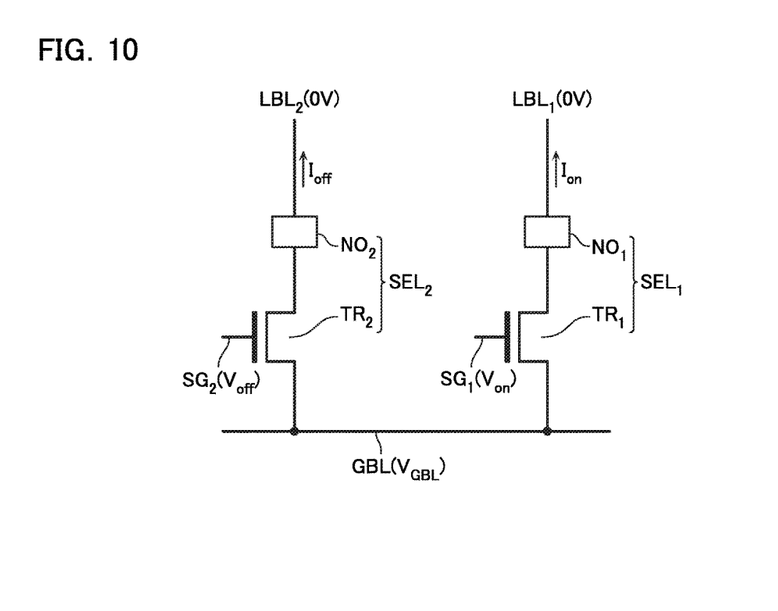
FIG. 10 is a schematic circuit diagram showing the configuration of a part of the semiconductor memory device.
Figure 11:
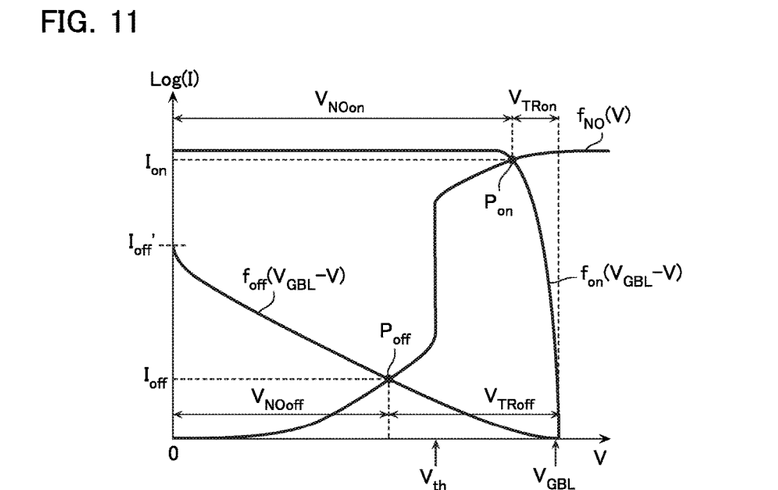
FIG. 11 is a schematic graph showing characteristics of the select element SEL including the select transistor TR and the nonlinear element NO.

Next, with reference to FIG. 10 and FIG. 11, the ON current $I_{on}$ and the leakage current $I_{off}$ of the select element SEL are explained.

FIG. 10 is a schematic circuit diagram showing the configuration of a part of the semiconductor memory device according to this embodiment. FIG. 10 shows the global bit line GBL, two select elements $SEL_1$ ($TR_1$, $NO_1$) and $SEL_2$ ($TR_2$, $NO_2$) connected to this global bit line GBL, and local bit lines $LBL_1$ and $LBL_2$ connected to these select elements $SEL_1$ and $SEL_2$. In the illustrated example, a predetermined voltage $V_{GBL}$ is applied to the global bit line GBL, and the local bit lines $LBL_1$ and $LBL_2$ have a potential of a grounding state (0V). Further, the select transistor $TR_1$ is in the ON state and the ON current $I_{on}$ is flowing through the select element $SEL_1$ ($TR_1$, $NO_1$). On the other hand, the select transistor $TR_2$ is in the OFF state, and the leakage current $I_{off}$ is flowing through the select element $SEL_2$ ($TR_2$, $NO_2$).

Here, the ON current $I_{on}$ can be expressed by using the functions explained with reference to FIG. 5 and FIG. 6. For example, when a voltage drop at the nonlinear element $NO_1$ is V, a voltage drop at the select transistor $TR_1$ is expressed as $V_{GBL}-V$. In this case, the current of the nonlinear element $NO_1$ is expressed by the function $f_{NO}(V)$, and the current of the select transistor $TR_1$ is expressed by the function $f_{on}(V_{GBL}-V)$. Since these currents are equal to the ON current $I_{on}$, the intersection of these functions show the ON current $I_{on}$.

Similarly, the leakage current $I_{off}$ can also be expressed by using the functions explained with reference to FIG. 5 and FIG. 6. For example, when a voltage drop at the nonlinear element $NO_2$ is V, a voltage drop at the select transistor $TR_2$ is expressed as $V_{GBL}-V$. In this case, the current of the nonlinear element $NO_2$ is expressed by the function $f_{NO}(V)$, and the current of the select transistor $TR_2$ is expressed by a function $f_{off}(V_{GBL}-V)$. Since these currents are equal to the leakage current $I_{off}$, the intersection of these functions shows the leakage current $I_{off}$.

FIG. 11 shows a graph in consideration of the above point, and shows the function $f_{NO}(V)$, the function $f_{on}(V_{GBL}-V)$ and the functions $f_{off}(V_{GBL}-V)$, and shows these intersections $P_{on}$ and $P_{off}$. The axis of abscissa shows a voltage V, and the axis of ordinate is a logarithmic axis which shows a current I.

As described above, the ON current $I_{on}$ is expressed by the intersection $P_{on}$ of the function $f_{NO}(V)$ and the function $f_{on}(V_{GBL}-V)$. Since a voltage drop $V_{TRon}$ at the select transistor $TR_1$ of the ON state is relatively small as illustrated, a voltage drop $V_{NOon}$ at the nonlinear element $NO_1$ is relatively large. Therefore, the voltage drop $V_{NOon}$ is larger than the threshold voltage $V_{th}$, and the nonlinear element $NO_1$ is in a low resistance state. Therefore, magnitude of ON current $I_{on}$ is substantially the same as the saturation current of the select transistor $TR_1$.

As described above, the leakage current $I_{off}$ is expressed by the intersection $P_{off}$ of the function $f_{NO}(V)$ and the function $f_{off}(V_{GBL}-V)$. Since the voltage drop $V_{TRoff}$ at the select transistor $TR_2$ in the OFF state is relatively large as illustrated, a voltage drop $V_{NOoff}$ at the nonlinear element $NO_2$ is relatively small. Therefore, the voltage drop $V_{NOoff}$ is smaller than the threshold voltage $V_{th}$, and the nonlinear element $NO_2$ is in a high resistance state. Therefore, the leakage current $I_{off}$ is small by several digits as compared with a leakage current $I_{off}'$ ($=f_{off}(V_{GBL})$) when the nonlinear element $NO_2$ is not used.

As mentioned above, according to the select element SEL according this embodiment, the leakage current can be reduced with few affection on the ON current. Therefore, if the length of the channel region (channel length) of the select transistor TR is shortened, for example, an increase of the ON current and a reduction of the leakage current can be realized simultaneously.

Second Embodiment

[Configuration]

Figure 12:
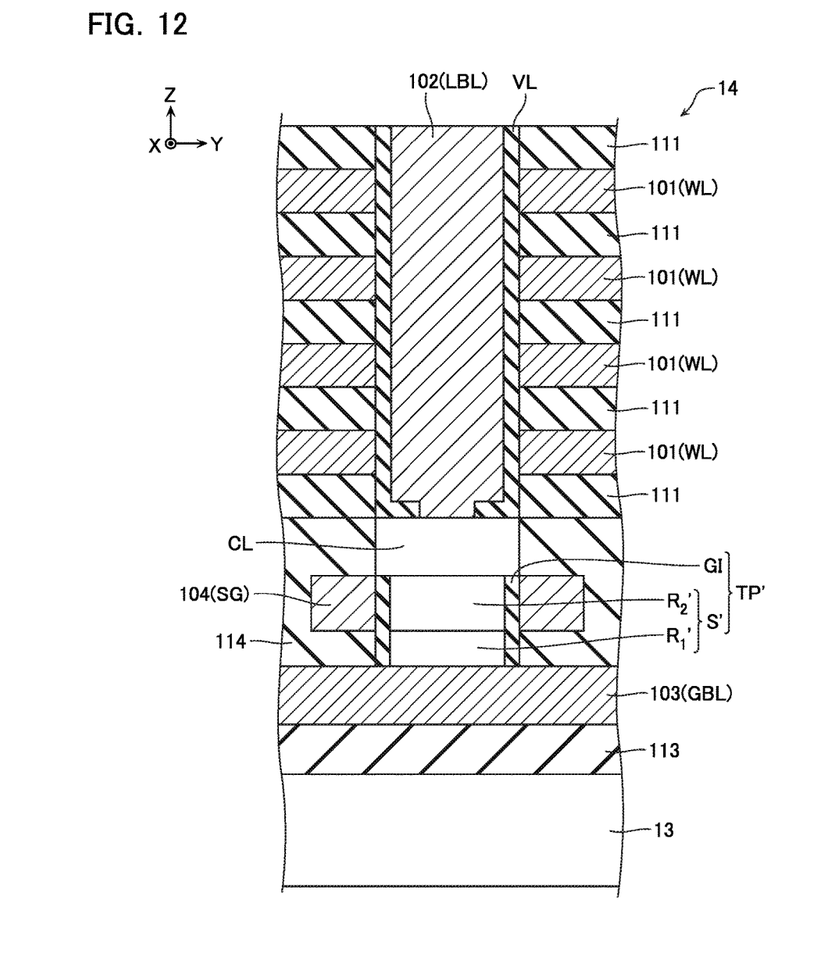
FIG. 12 is a schematic sectional view showing a configuration of a part of a semiconductor memory device according to a second embodiment.

Next, with reference to FIG. 12, a configuration of a semiconductor memory device according to a second embodiment will be described.

Although the semiconductor memory device according to this embodiment is basically the same as the semiconductor memory device according to the first embodiment, a part of a configuration of a semiconductor layer S' of a transistor portion TP' differs from the configuration of the semiconductor memory device according to the first embodiment. The semiconductor layer S' is connected to the third wiring 103 and the semiconductor layer S' includes a first semiconductor region $R_1'$ and a second semiconductor region $R_2'$. The first semiconductor region $R_1'$ is located in a lower position than the second semiconductor region $R_2'$. In addition, the first semiconductor region $R_1'$ includes impurities of n type such as phosphorus (P), for example, and functions as a source region of the select transistor TR. The second semiconductor region $R_2'$ is located in an upper position than the first semiconductor region $R_1'$ and is located between the first semiconductor region $R_1'$ and the chalcogen layer CL. In addition, the second semiconductor region $R_2'$ includes impurities of p type such as boron (B), for example, and functions as a channel region of the select transistor TR. In addition, in this embodiment, the chalcogen layer CL is connected to an upper surface of the second semiconductor region $R_2'$ of the semiconductor layer S'.

[Characteristic of Select Element SEL]

A select element SEL according to this embodiment has an advantageous effects as compared with the first embodiment. Hereinafter, the advantageous effects will be described.

As described above, the variable resistance film VL is set to a low resistance state by applying a predetermined set voltage, and is reset to a high resistance state by applying a predetermined reset voltage. Here, depending on types or the like of the variable resistance film VL, sometimes the set voltage is smaller than the reset voltage. Additionally, sometimes the set voltage has a different polarity from a polarity of the reset voltage. Hereinafter, a current which flows from the local bit line LBL into the global bit line GBL is called a forward direction current, and a voltage applied in this direction is called a forward direction voltage. Similarly, a current which flows from the global bit line GBL into the local bit line LBL is called an opposite direction current, and a voltage applied in this direction is called an opposite direction voltage. Hereinafter, an example in which the set voltage is the forward direction voltage and the reset voltage is the opposite direction voltage will be described.

Figure 13:
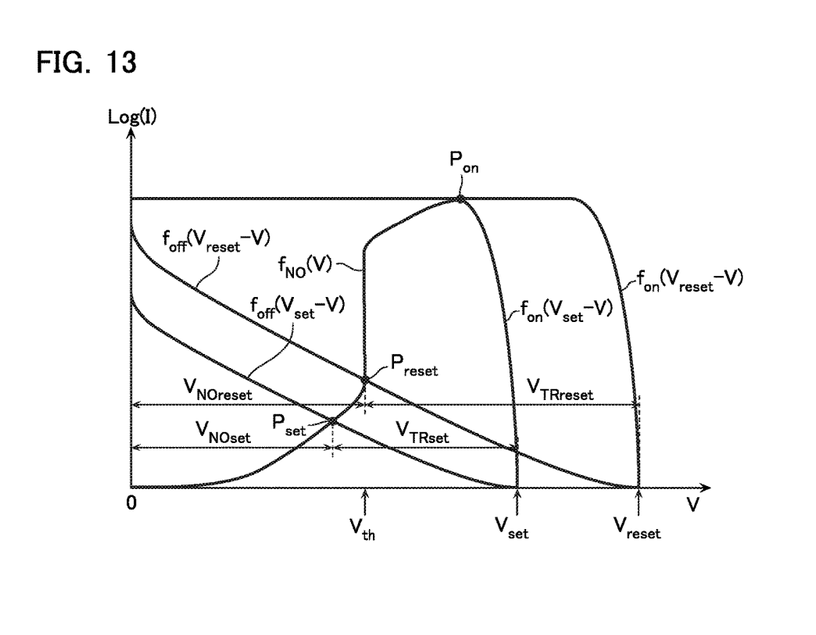
FIG. 13 is a schematic graph showing characteristics of the select element SEL including the select transistor TR and the nonlinear element NO.

FIG. 13 shows a schematic graph showing characteristics of the select element SEL according to the first embodiment. Although FIG. 13 is basically the same as FIG. 11, in addition to the function $f_{NO}(V)$ showing the current of the nonlinear element NO, as characteristics of the select transistor TR, a function $f_{on}(V_{set}-V)$ and a function $f_{off}(V_{set}-V)$ showing currents when the set voltage is applied, and, a function $f_{on}(V_{reset}-V)$ and a function $f_{off}(V_{reset}-V)$ showing currents when the reset voltage is applied are illustrated.

When the set voltage is applied, the leakage current is expressed by an intersection $P_{set}$ of the function $f_{NO}(V)$ and the function $f_{off}(V_{set}-V)$. In an illustrated example, a voltage drop $V_{NOset}$ at the nonlinear element NO is smaller than the threshold voltage $V_{th}$, and the nonlinear element NO is in a high resistance state.

When the reset voltage is applied, the leakage current is expressed by an intersection $P_{reset}$ of the function $f_{NO}(V)$ and the function $f_{off}(V_{reset}-V)$. Here, as described above, the reset voltage $V_{reset}$ is larger than the set voltage $V_{set}$. Therefore, both of a voltage drop $V_{TRreset}$ at the select transistor TR and a voltage drop $V_{NOreset}$ at the nonlinear element NO are larger than the voltage drops when the set voltage is applied. As a result, there is a possibility that the voltage drop $V_{NOreset}$ may be substantially the same as or larger than the threshold voltage $V_{th}$ as shown in FIG. 13. In the illustrated example, although the nonlinear element NO is kept in a high resistance state, sometimes control of the nonlinear element NO in such a state is difficult, and therefore there is a possibility that the nonlinear element NO changes to the low resistance state. Thereby, there is a possibility that the leakage current increases.

In order to control this, it is considerable to set the threshold voltage $V_{th}$ larger enough than the voltage corresponding to an operating point $P_{reset}$, for example. However, if the threshold voltage $V_{th}$ is increased too much, there is a possibility that the threshold voltage $V_{th}$ comes close to a voltage corresponding to the operating point $P_{on}$. In this case, there is a possibility that the nonlinear element NO becomes to a high resistance state when the set voltage is applied, and there is a possibility that the ON current decreases.

Therefore, in this embodiment, a structure where the chalcogen layer CL is connected to the upper surface of the second semiconductor region $R_2'$ of the semiconductor layer S' is employed. According to such composition, it is possible to make the threshold voltage when the forward direction voltage is applied different from the threshold voltage when the opposite direction voltage is applied. Thereby, in both cases when the forward direction voltage is applied and the opposite direction voltage is applied, a condition of the chalcogen layer CL can be preferably controlled. Hereinafter, this point will be described.

Figure 14:
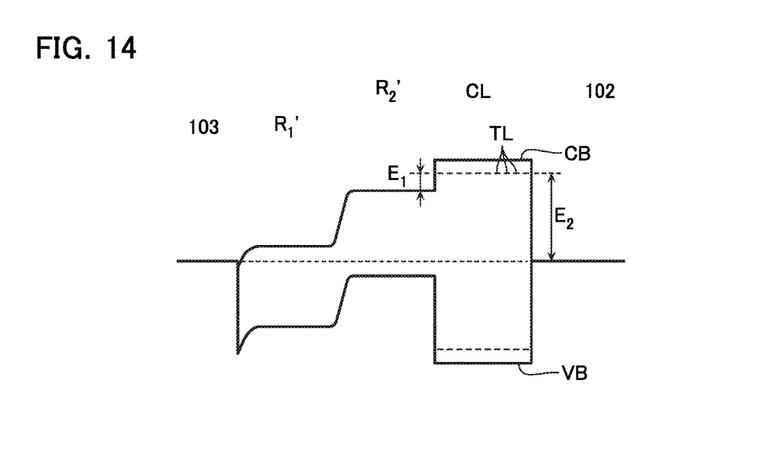
FIG. 14 is a schematic energy band diagram of the select element SEL according to the second embodiment.
Figure 15:
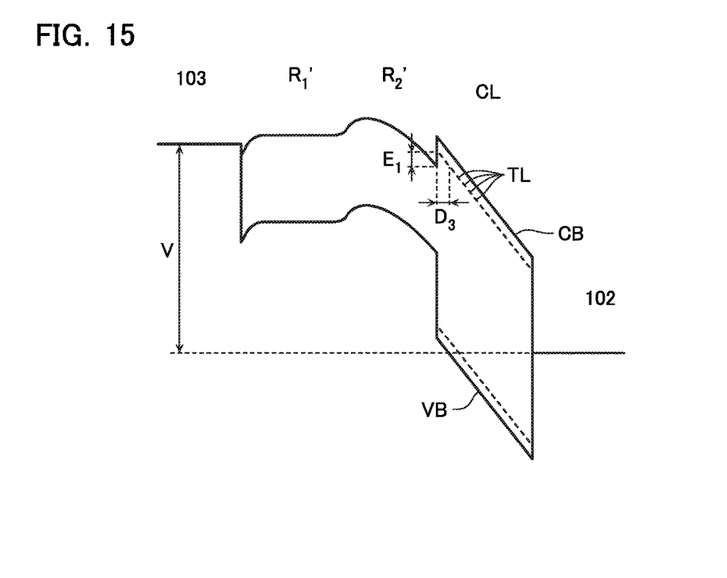
FIG. 15 is a schematic energy band diagram of the select element SEL.
Figure 16:
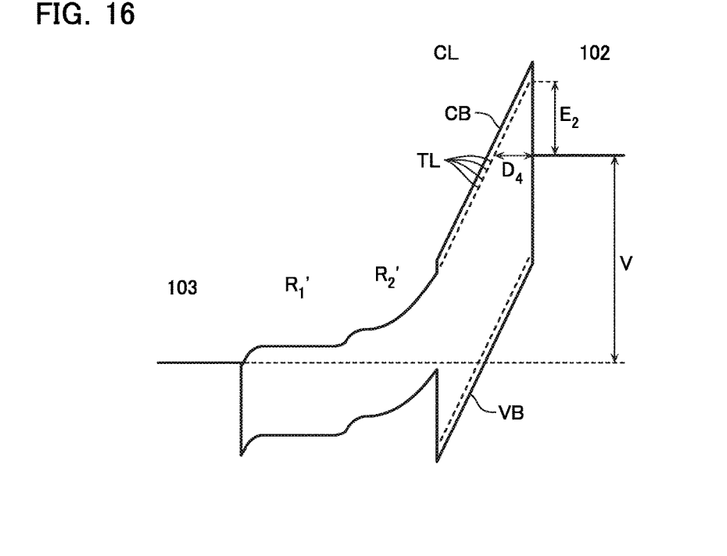
FIG. 16 is a schematic energy band diagram of the select element SEL.

FIG. 14-FIG. 16 are schematic energy band diagrams of the select element SEL according to the second embodiment, and are illustrating energy conditions in the third wiring 103, the first semiconductor region $R_1'$, the second semiconductor region $R_2'$, the chalcogen layer CL, and the second wiring 102.

In an example shown in FIG. 14, the third wiring 103 which includes metals or the like contacts the first semiconductor region $R_1'$ which includes n type polycrystalline silicon or the like, and a junction between the third wiring 103 and the first semiconductor region $R_1'$ is an Ohmic junction. In addition, the first semiconductor region $R_1'$ contacts the second semiconductor region $R_2'$ which includes p type polycrystalline silicon or the like, and a junction between the first semiconductor region $R_1'$ and the second semiconductor region $R_2'$ is a pn junction. In addition, the second semiconductor region $R_2'$ contacts the chalcogen layer CL, and an energy barrier $E_1$ exists between the second semiconductor region $R_2'$ and a trap level TL of the chalcogen layer CL. In addition, the chalcogen layer CL contacts the second wiring 102 which includes metals or the like, and an energy barrier $E_2$ exists between the trap level TL of the chalcogen layer CL and the second wiring 102. The energy barrier $E_1$ is smaller than the energy barrier $E_2$.

As shown in FIG. 15, when a forward direction voltage V is applied between the third wiring 103 and the second wiring 102, a potential gradient arises in the chalcogen layer CL, and a trap level TL which exists in a position apart by a distance $D_3$ from the second semiconductor region $R_2'$ becomes substantially the same as an energy level of a lower end of a conduction band of the second semiconductor region $R_2'$. When the voltage V reaches the threshold voltage, a phenomenon described with reference to FIGS. 7-9 occurs, and the chalcogen layer CL becomes to a low resistance state.

As shown in FIG. 16, when an opposite direction voltage V is applied between the third wiring 103 and the second wiring 102, a potential gradient arises in the chalcogen layer CL, and a trap level TL which exists in a position apart by a distance $D_4$ from the second wiring 102 becomes substantially the same as an energy level in the second wiring 102. When the voltage V reaches the threshold voltage, a phenomenon described with reference to FIGS. 7-9 occurs, and the chalcogen layer CL becomes to a low resistance state.

Here, as illustrated, the energy barrier $E_1$ is smaller than the energy barrier $E_2$. Therefore, the above-mentioned distance $D_3$ (shown in FIG. 15) reaches a distance in which the electrons $e^-$ tunnel more easily than the above-mentioned distance $D_4$ (shown in FIG. 16). Moreover, as shown in FIG. 15, when the forward direction voltage is applied, a potential gradient arises also in the second semiconductor region $R_2'$, and, the electrons in the second semiconductor region $R_2'$ are accelerated by this potential gradient. Therefore, the electrons in the second semiconductor region $R_2'$ when the forward direction voltage is applied more easily tunnel into the trap level TL than the electrons in the second wiring 102 when the opposite direction voltage is applied. Accordingly, when the forward direction voltage is applied, the chalcogen layer CL can be changed into a low resistance state more easily than when the opposite direction voltage is applied. That is, the threshold voltage when the forward direction voltage is applied is smaller than the threshold voltage when the opposite direction voltage is applied.

Figure 17:
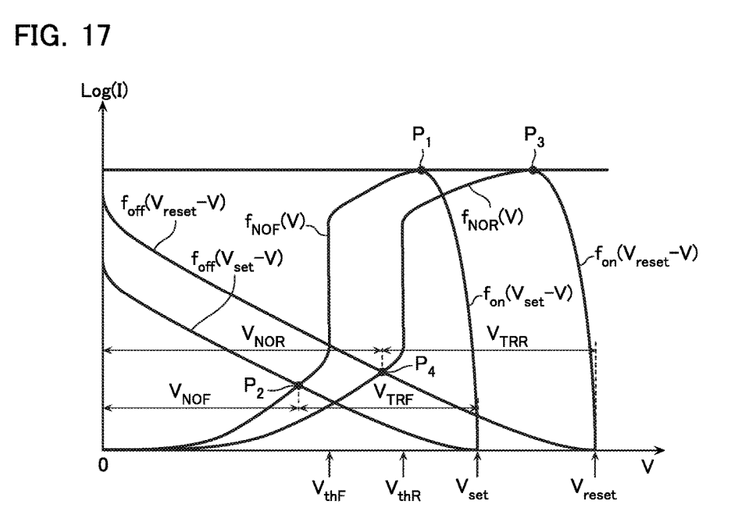
FIG. 17 is a schematic graph showing characteristics of the select element SEL according to the second embodiment.

FIG. 17 is a schematic graph showing characteristics of the select element SEL according to this embodiment. Although FIG. 17 is basically the same as FIG. 13, a function $f_{NOF}(V)$ showing a current when the forward direction voltage is applied and a function $f_{NOR}(V)$ showing a current when the opposite direction voltage is applied are illustrated as the characteristics of the nonlinear element NO. As illustrated, a threshold voltage $V_{thF}$ in the function $f_{NOF}(V)$ (a threshold voltage when the forward direction voltage is applied) is smaller than a threshold voltage $V_{thR}$ in the function $f_{NOR}(V)$ (a threshold voltage when the opposite direction voltage is applied).

The ON current when the set voltage is applied is expressed by an intersection $P_1$ of the function $f_{NOF}(V)$ and the function $f_{on}(V_{set}-V)$. In the illustrated example, a voltage drop at the nonlinear element NO is larger than a threshold voltage $V_{thF}$, and the nonlinear element NO is in a low resistance state.

The leakage current when the set voltage is applied is expressed by an intersection $P_2$ of the function $f_{NOF}(V)$ and the function $f_{off}(V_{set}-V)$. In the illustrated example, a voltage drop $V_{NOF}$ at the nonlinear element NO is smaller than the threshold voltage $V_{thF}$, and the nonlinear element NO is in a high resistance state.

The ON current when the reset voltage is applied is expressed by an intersection $P_3$ of the function $f_{NOR}(V)$ and the function $f_{on}(V_{reset}-V)$. In the illustrated example, a voltage drop at the nonlinear element NO is larger than the threshold voltage $V_{thR}$, and the nonlinear element NO is in a low resistance state.

The leakage current when the reset voltage is applied is expressed by an intersection $P_4$ of the function $f_{NR}(V)$ and the function $f_{off}(V_{reset}-V)$. In the illustrated example, a voltage drop $V_{NOR}$ at the nonlinear element NO is smaller than the threshold voltage $V_{thR}$, and the nonlinear element NO is in a high resistance state.

In the illustrated example, the reset voltage $V_{reset}$ is larger than the set voltage $V_{set}$ like the example of FIG. 13. However, unlike the example of FIG. 13, the threshold voltage $V_{thF}$ of the nonlinear element NO when the opposite direction voltage is applied is larger than the threshold voltage $V_{thF}$ when the forward direction voltage is applied. Therefore, it is possible to set a voltage in the operating point $P_1$ larger enough than the threshold voltage $V_{thF}$, and to set a voltage in the operating point $P_4$ smaller enough than the threshold voltage $V_{thR}$. Thereby, in both cases when the forward direction voltage is applied and when the opposite direction voltage is applied, a condition of the chalcogen layer CL can be preferably controlled.

Other Embodiments

In the first and second embodiments, the third wiring 103 is provided lower than the second wiring 102. However, the third wiring 103 may be provided upper than the second wiring 102. In addition, in the first and second embodiments, the chalcogen layer CL is provided between the second wiring 102 and the transistor portion TP or TP'. However, the chalcogen layer CL may be provided between the third wiring 103 and the transistor portion TP or TP'. For example, the semiconductor layer S may be connected to the second wiring 102, and the chalcogen layer CL may be connected to the semiconductor layer S, and the first semiconductor region $R_1$ may be provided in an upper position than the second semiconductor region $R_2$ and the third semiconductor region $R_3$, and the second semiconductor region $R_2$ may be provided in a lower position than the first semiconductor region $R_1$ and the third semiconductor region $R_3$. Similarly, for example, the semiconductor layer S' may be connected to the second wiring 102, and the chalcogen layer CL may be connected to the semiconductor layer S', and the first semiconductor region $R_1$ may be provided in an upper position than the second semiconductor region $R_2'$, and the second semiconductor region $R_2'$ may be provided in a lower position than the first semiconductor region $R_1'$. Further, the chalcogen layer CL may be provided for both positions between the second wiring 102 and the transistor portion TP or TP' and between the third wiring 103 and the transistor portion TP or TP'.

For example, in the second embodiment, the set voltage is smaller than the reset voltage. Additionally, the set voltage is the forward direction voltage and the reset voltage is the opposite direction voltage. However, for example, in a case where the set voltage is larger than the reset voltage, in a case where the set voltage is the opposite direction voltage and the reset voltage is the forward direction voltage, or the like, it is possible to achieve the same effect as the second embodiment by providing the chalcogen layer CL between the transistor portion TP' and the third wiring 103, and providing the first semiconductor region $R_1'$ in an upper position than the second semiconductor region $R_2'$, and providing the second semiconductor region $R_2'$ in a lower position than the first semiconductor region $R_1'$.

In cases where an annealing treatment is used in a manufacturing process of the semiconductor layer S or the semiconductor layer S', and the chalcogen layer CL is weak against heat and the like, for example, it is preferred that the chalcogen layer CL is provided in an upper position than the transistor portion TP or TP'. Similarly, in a case where the variable resistance film VL is weak against heat, and the like, for example, it is preferred that the variable resistance film VL is provided in an upper position than the transistor portion TP or TP'.

In the first and second embodiments, examples in which careers of the select transistor TR are electrons are described. For example, in a case where the conductivity types of the first semiconductor region $R_1$ and the second semiconductor region $R_2$ of the semiconductor layer S, and the conductivity type of the first semiconductor region $R_1'$ of the semiconductor layer S' are considered as a first conductivity type, and, the conductivity types of the third semiconductor region $R_3$ of the semiconductor layer S and the second semiconductor region $R_2'$ of the semiconductor layer S' are considered as a second conductivity type, an example in which the first conductivity type is an n type and the second conductivity type is a p type is described. However, the careers of the select transistor TR may be holes. In this case, the first conductivity type may be a p type, and the second conductivity type may be an n type. In this case, with considering a point that a direction to which a hole moves corresponds with a direction which a current flows, the above-mentioned configuration can be appropriately adjusted.

Note that like the second embodiment, even if the set voltage is smaller than the reset voltage and the polarity of the set voltage differs from the reset voltage, it is also possible to employ the same configuration as the select element SEL according to the first embodiment. In this case, for example, in the erasing operation, a plurality of local bit lines LBL may be connected to one global bit line GBL via the select element SEL, and the reset voltage may be applied to a plurality of memory cells MC simultaneously. According to such a method, it is possible to provide a semiconductor memory device which can be preferably controlled, without worrying about the leakage current when the reset voltage is applied to the select element SEL.

OTHERS

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate;
a plurality of first wirings arranged in a first direction crossing a surface of the substrate;
a second wiring extending in the first direction;
a variable resistance film provided between the first wiring and the second wiring;
a third wiring extending in a second direction crossing the first direction;
a select transistor provided between an end of the second wiring and the third wiring; and
a chalcogen layer provided at at least one of a position between the end of the second wiring and the select transistor, and, a position between the third wiring and the select transistor, wherein
the select transistor comprises:
a semiconductor layer being connected to the second wiring or the third wiring, and including:
a first semiconductor region;
a second semiconductor region between the first semiconductor region and the chalcogen layer; and
a third semiconductor region between the first and second semiconductor regions; and
a gate electrode facing the third semiconductor region.

2. The semiconductor memory device according to claim 1, wherein
the first and second semiconductor regions include impurities of a first conductivity type,
the third semiconductor region includes impurities of a second conductivity type, and
the second conductivity type differs from the first conductivity type.

3. A semiconductor memory device comprising:
a substrate;
a plurality of first wirings arranged in a first direction crossing a surface of the substrate;
a second wiring extending in the first direction;
a variable resistance film provided between the first wiring and the second wiring;
a third wiring extending in a second direction crossing the first direction;
a select transistor provided between an end of the second wiring and the third wiring; and
a chalcogen layer provided at at least one of a position between the end of the second wiring and the select transistor, and, a position between the third wiring and the select transistor, wherein
the select transistor comprises:
a semiconductor layer being connected to the second wiring or the third wiring, and including:
a first semiconductor region; and
a second semiconductor region between the first semiconductor region and the chalcogen layer; and
a gate electrode facing the second semiconductor region, and
the chalcogen layer is connected to the second semiconductor region.

4. The semiconductor memory device according to claim 3, wherein
the first semiconductor region includes impurities of a first conductivity type,
the second semiconductor region includes impurities of a second conductivity type, and
the second conductivity type differs from the first conductivity type.

5. A semiconductor memory device comprising:
a substrate;
a plurality of first wirings arranged in a first direction crossing a surface of the substrate;
a second wiring extending in the first direction;
a variable resistance film provided between the first wiring and the second wiring;
a third wiring extending in a second direction crossing the first direction;
a select transistor connected to the third wiring; and
a chalcogen layer connected to the select transistor and the second wiring, wherein
the select transistor comprises:
a semiconductor layer including one end connected to the third wiring, and, the other end connected to the chalcogen layer; and
a gate electrode facing the semiconductor layer in the second direction.

6. The semiconductor memory device according to claim 5, wherein
the semiconductor layer comprises:
a first semiconductor region;
a second semiconductor region between the first semiconductor region and the chalcogen layer; and
a third semiconductor region between the first and second semiconductor regions, and
the gate electrode faces the third semiconductor region.

7. The semiconductor memory device according to claim 6, wherein
the first and second semiconductor regions include impurities of a first conductivity type, the third semiconductor region includes impurities of a second conductivity type, and the second conductivity type differs from the first conductivity type.

8. The semiconductor memory device according to claim 5, wherein the semiconductor layer comprises:

a first semiconductor region; and a second semiconductor region between the first semiconductor region and the chalcogen layer, the gate electrode faces the second semiconductor region, and the chalcogen layer is connected to the second semiconductor region.

9. The semiconductor memory device according to claim 8, wherein the first semiconductor region includes impurities of a first conductivity type, the second semiconductor region includes impurities of a second conductivity type, and the second conductivity type differs from the first conductivity type.

\* \* \* \* \*